United States Patent
Yamanaka

(10) Patent No.: US 11,311,975 B2
(45) Date of Patent: Apr. 26, 2022

(54) TILT ADJUSTING MECHANISM FOR CHUCK TABLE

(71) Applicant: DISCO CORPORATION, Tokyo (JP)

(72) Inventor: Satoshi Yamanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 54 days.

(21) Appl. No.: 16/874,828

(22) Filed: May 15, 2020

(65) Prior Publication Data
US 2020/0384590 A1  Dec. 10, 2020

(30) Foreign Application Priority Data

Jun. 4, 2019 (JP) .............................. JP2019-104372

(51) Int. Cl.
*B23Q 1/54* (2006.01)
*H01L 21/687* (2006.01)

(52) U.S. Cl.
CPC ...... *B23Q 1/5437* (2013.01); *H01L 21/68785* (2013.01)

(58) Field of Classification Search
CPC ............... H01L 21/68; H01L 21/68792; H01L 21/68785
See application file for complete search history.

(56) References Cited

U.S. PATENT DOCUMENTS

| 5,545,962 A * | 8/1996 | Wakui | G03F 7/707 318/563 |
| 2017/0153186 A1 * | 6/2017 | Jeanne | H01L 22/12 |

FOREIGN PATENT DOCUMENTS

JP    0890376 A    4/1996

* cited by examiner

Primary Examiner — Tyrone V Hall, Jr.
(74) Attorney, Agent, or Firm — Greer Burns & Crain, Ltd.

(57) ABSTRACT

A tilt adjusting mechanism provided in a processing apparatus including a chuck table having a holding surface for holding a workpiece thereon and a processing unit having a processing surface for processing the workpiece held on the chuck table, for adjusting parallelism between the holding surface and the processing surface. The tilt adjusting mechanism includes at least three support posts supporting the chuck table, the support posts including at least one expansible and contractible support post that is provided with a piezoelectric actuator including layered piezoelectric elements, a direct current power supply electrically connected to the piezoelectric actuator, and a voltage controller for controlling a direct current voltage value of direct current electric power supplied to the piezoelectric actuator.

1 Claim, 2 Drawing Sheets

TILT ADJUSTING MECHANISM FOR CHUCK TABLE

BACKGROUND OF THE INVENTION

Field of the Invention

The present invention relates to a tilt adjusting mechanism including a piezoelectric actuator for adjusting the tilt of a chuck table.

Description of the Related Art

A grinding apparatus for grinding a workpiece using grinding stones includes a chuck table having a holding surface for holding a workpiece thereon. Some grinding apparatuses each include a position adjusting unit for tilting the chuck table to keep the holding surface parallel to the processing surfaces of grinding stones, as disclosed in Japanese Patent Laid-open No. H08(1996)-090376.

The position adjusting unit disclosed in JP-H08(1996)-090376 A includes an externally threaded shaft for adjusting the vertical position of a chuck table that is rotatable about its own axis by an electric motor. The externally threaded shaft has threaded portions that are threaded in respective nuts disposed in a base and a flange of a table support base that supports a chuck table. Actually, there are three position adjusting units disposed in angularly equally spaced positions on the flange of the table support base. The externally threaded shafts can be turned manually directly or by a tool to change their vertical positions, thereby adjusting the vertical position of the chuck table and hence the tilt of the chuck table with respect to the base.

SUMMARY OF THE INVENTION

In recent years, as workpieces to be ground have become larger in size, chuck tables for holding the workpieces also have become larger in size and hence weight. Heavier chuck tables pose a problem on the position adjusting unit in that, when the externally threaded shaft is rotated through a given angle, the externally threaded shaft undergoes increased thread friction, possibly failing to change the tilt of the chuck table by a given degree depending on the angle. Therefore, there are demands for a capability to change the tilt of a chuck table by a desired degree even though the chuck table is heavy.

Another problem is that, even when the externally threaded shaft is rotated through a small angle, the externally threaded shaft tends to be twisted due to thread friction and fails to change the tilt of the chuck table. Furthermore, since the externally threaded shaft and the nuts threaded thereover suffer backlash, it is necessary to eliminate the backlash for correctly changing the tilt of the chuck table, resulting in a time-consuming tilt adjusting process. There are also demands for a capability to make fine tilt adjustments.

It is therefore an object of the present invention to provide a tilt adjusting mechanism that is capable of easily adjusting the tilt of a chuck table.

In accordance with an aspect of the present invention, there is provided a tilt adjusting mechanism provided in a processing apparatus including a chuck table having a holding surface for holding a workpiece thereon and a processing unit having a processing surface for processing the workpiece held on the chuck table, for adjusting parallelism between the holding surface and the processing surface, and the tilt adjusting mechanism includes: at least three support posts supporting the chuck table, the support posts including at least one expansible and contractible support post that is provided with a piezoelectric actuator comprising layered piezoelectric elements; a direct current power supply electrically connected to the piezoelectric actuator; and a voltage controller for controlling a direct current voltage value of direct current electric power supplied to the piezoelectric actuator, in which the DC electric power whose direct current voltage value has been controlled by the voltage controller is supplied to the piezoelectric actuator to control the length of the expansible and contractible support post for thereby adjusting the parallelism between the holding surface and the processing surface.

Since the tilt adjusting mechanism adjusts the tilt of the chuck table by changing the DC voltage value of the DC electric power supplied to the piezoelectric actuator, the tilt of the chuck table can be changed reliably by a desired degree. Furthermore, it is not necessary to eliminate backlash for changing the tilt of the chuck table, and hence, the amount of work required for tilt adjustment is reduced. Furthermore, the tilt of the chuck table can be adjusted by a slight degree by slightly changing the DC voltage value of the DC electric power supplied to the piezoelectric actuator with the voltage controller.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
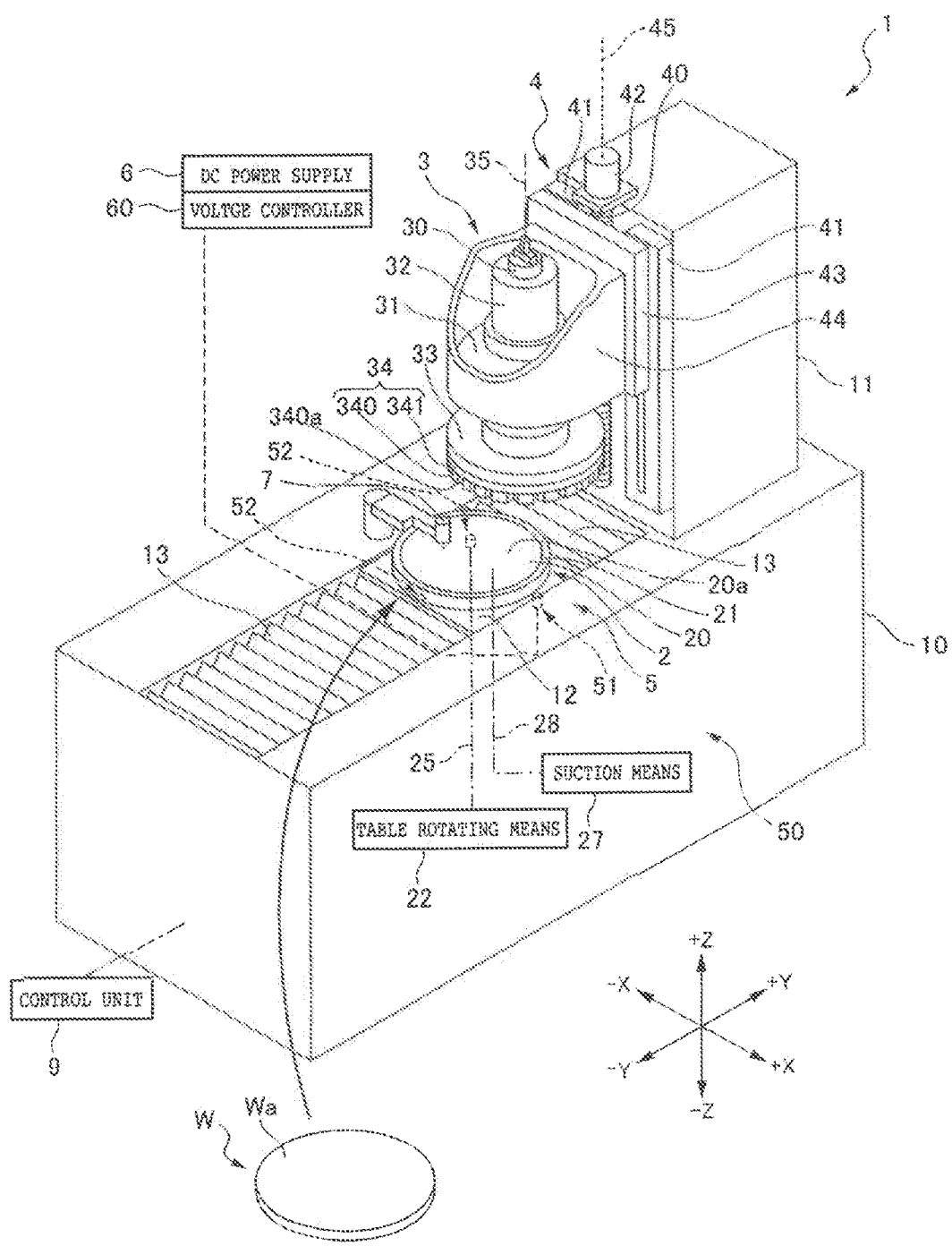
FIG. 1 is a perspective view illustrating a grinding apparatus in its entirety, the grinding apparatus incorporating a tilt adjusting mechanism according to an embodiment of the invention.

A grinding apparatus 1 illustrated in FIG. 1 is a grinding apparatus for grinding an upper surface Wa of a workpiece W such as a semiconductor wafer or the like in the shape of a circular plate held on a holding surface 20*a* of a chuck table 2 by abrasively keeping processing surfaces 340*a* of a plurality of grinding stones 340 against the upper surface Wa of the workpiece W. The grinding apparatus 1 includes therein a tilt adjusting mechanism 5 according to a preferred embodiment of the present invention for adjusting the parallelism between the holding surface 20*a* and the processing surfaces 340*a*. The grinding apparatus 1 and the tilt adjusting mechanism 5 will be described in detail below.

As illustrated in FIG. 1, the grinding apparatus 1 includes a control unit 9 for controlling various mechanisms of the grinding apparatus 1. The grinding apparatus 1 also includes a base 10 extending in Y-axis directions and a column 11 erected on an end portion of the base 10 in a +Y direction that is one of the Y-axis directions.

Figure 2:
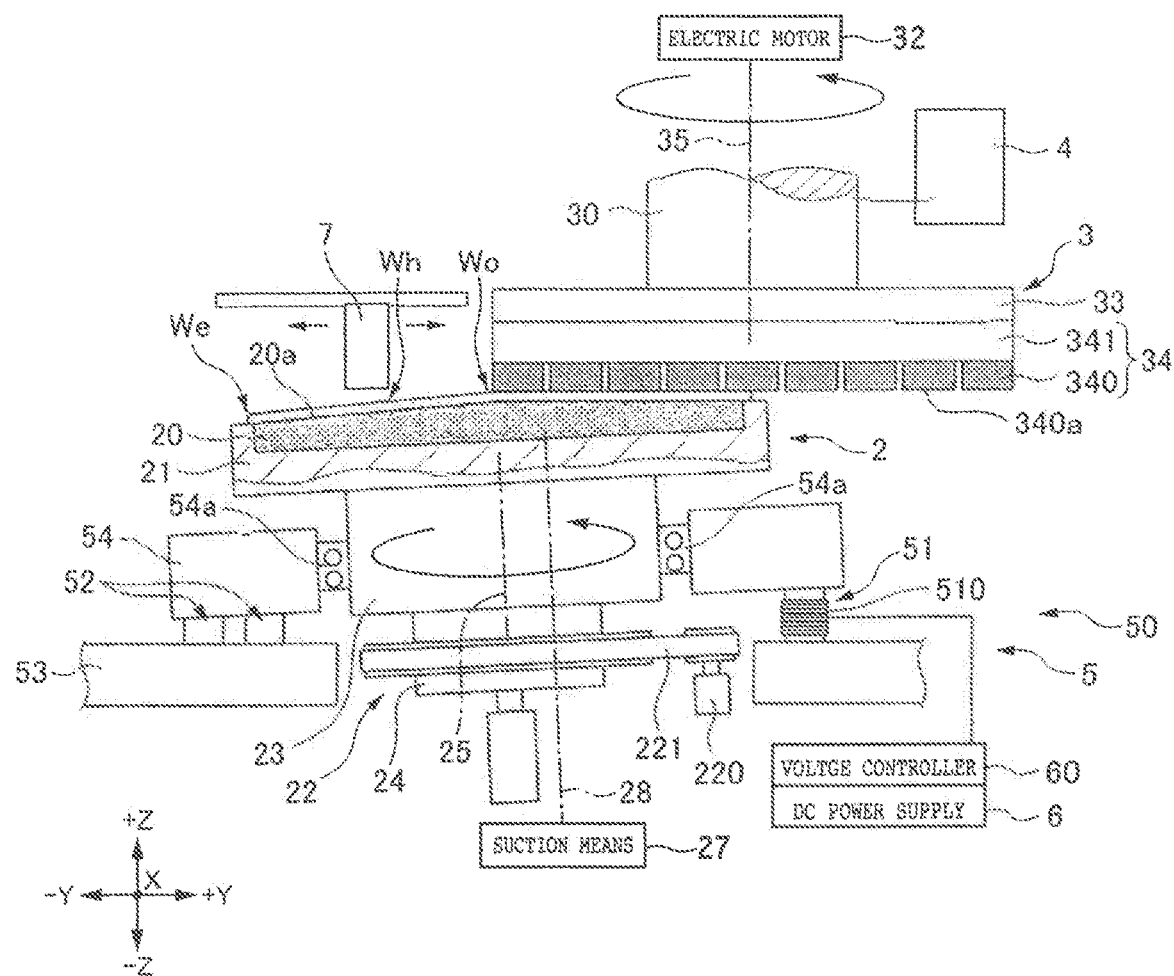
FIG. 2 is a sectional side elevational view of the grinding apparatus, illustrating the manner in which a workpiece is ground by the grinding apparatus.

As illustrated in FIGS. 1 and 2, the chuck table 2 that is shaped as a circular plate is disposed on the base 10 of the grinding apparatus 1. The chuck table 2 includes a suction member 20 and a frame 21 supporting the suction member 20. The suction member 20, which is typically made of a porous material, has an upper surface functioning as the holding surface 20a for holding the workpiece W under suction thereon. Suction means 27 is connected through a suction channel 28 to the holding surface 20a of the chuck table 2. While the workpiece W is placed on the holding surface 20a, the suction means 27 is actuated to produce suction force. The suction force is transmitted through the suction channel 28 to the holding surface 20a where the suction force acts therethrough on the workpiece W, holding the workpiece W under suction on the holding surface 20a of the chuck table 2.

As illustrated in FIG. 2, the chuck table 2 overlies table rotating means 22 having a table base 23 that supports the chuck table 2 thereon and a support 24 that supports the table base 23 for rotation therewith. The table rotating means 22 also includes an electric motor 220 disposed in a position adjacent to the support 24. The support 24 is operatively coupled to the electric motor 220 by a transmission belt 221. When the electric motor 220 is energized, the rotational force of the electric motor 220 is transmitted by the transmission belt 221 to the support 24, rotating the support 24 about its own axis. The chuck table 2 that is coupled to the support 24 through the table base 23 is now rotated about a rotational axis 25 extending in Z-axis directions.

As illustrated in FIG. 1, a cover 12 is disposed around the chuck table 2 and coupled on both sides thereof with a bellows 13 that is stretchable and contractible in the Y-axis directions. When the chuck table 2 is moved in the Y-axis directions by horizontal moving means, not shown, for example, the cover 12 is also moved in the Y-axis directions in unison with the chuck table 2, stretching and contracting the bellows 13.

As illustrated in FIGS. 1 and 2, there is disposed above the base 10 non-contact thickness measuring means 7 for applying a laser beam to the upper surface Wa of the workpiece W, for example, to measure the thickness of the workpiece W while the workpiece W is being ground. The non-contact thickness measuring means 7 is horizontally movable to measure thicknesses of the workpiece W at different locations thereon.

As illustrated in FIG. 1, a grinding feed mechanism 4 that supports a grinding unit 3, for example, is disposed on a side surface of the column 11 that faces in a-Y direction that is the other of the Y-axis directions. As illustrated in FIG. 1, the grinding unit 3 includes a spindle 30 having a rotational axis 35 extending in the Z-axis directions, a housing 31 by which the spindle 30 is rotatably supported, an electric motor 32 coupled to the spindle 30 for rotating the spindle 30 about the rotational axis 35, an annular mount 33 connected to a lower end of the spindle 30, and a grinding wheel 34 detachably mounted on a lower surface of the mount 33. The grinding wheel 34 includes a wheel base 341, and the plurality of grinding stones 340 that are disposed in an annular array on a lower surface of the wheel base 341. Each of the grinding stones 340 is substantially shaped as a rectangular parallelepiped. The grinding stones 340 have respective lower surfaces functioning as the respective processing surfaces 340a for grinding the workpiece W.

As illustrated in FIG. 1, the grinding feed mechanism 4 includes a ball screw 40 having a rotational axis 45 extending in the Z-axis directions, a pair of guide rails 41 disposed one on each side of the ball screw 40 and extending parallel to the ball screw 40, an electric motor 42 coupled to an upper end of the ball screw 40 for rotating the ball screw 40 about the rotational axis 45, a vertically movable plate 43 having an inner nut threaded over the ball screw 40 and opposite side portions held in sliding contact with the guide rails 41, and a holder 44 coupled to the vertically movable plate 43 and holding the spindle 30. When the electric motor 42 is energized, it rotates the ball screw 40 about the rotational axis 45, causing the vertically movable plate 43 to move vertically in the Z-axis directions while being guided by the guide rails 41 thereby to move the grinding unit 3 held by the holder 44 vertically in the Z-axis directions.

As illustrated in FIGS. 1 and 2, the grinding apparatus 1 incorporates the tilt adjusting mechanism 5 that adjusts the parallelism between the holding surface 20a and the processing surfaces 340a, as described above. The tilt adjusting mechanism 5 includes an expansible and contractible support post 51 and a voltage controller 60. As illustrated in FIG. 2, an inner base 53 is disposed below the chuck table 2, and at least three support posts 50 are disposed on the inner base 53. At least one of the three support posts 50 acts as the expansible and contractible support post 51 that includes a piezoelectric actuator 510 in the form of layered piezoelectric elements and that is expansible and contractible in the Z-axis directions. The other support posts 50 act as fixed support posts 52 that are not expansible and contractible.

In FIG. 2, one expansible and contractible support post 51 and two fixed support posts 52 are disposed on the inner base 53. However, all of the three support posts 50 may be expansible and contractible support posts 51, or two of the three support posts 50 may be expansible and contractible support posts 51 whereas the remaining one may be a fixed support post 52. As illustrated in FIG. 2, an annular joint member 54 surrounding the table base 23 is disposed on upper ends of the three support posts 50, for example, and have respective sides 54a joined to the table base 23. The chuck table 2 is thus supported on the support posts 50 through the joint member 54 and the table base 23.

As illustrated in FIG. 2, the expansible and contractible support post 51 is electrically connected to the voltage controller 60 that is electrically connected to a DC power supply 6. The voltage controller 60 has a function to control the DC voltage value of DC electric power supplied from the DC power supply 6 to the piezoelectric actuator 510 of the expansible and contractible support post 51.

When DC electric power whose DC voltage value has been controlled by the voltage controller 60 is supplied to the piezoelectric actuator 510, the piezoelectric actuator 510 is expanded and contracted in the Z-axis directions to adjust the expansible and contractible support post 51 to a predetermined length. In this manner, the joint member 54 is angularly moved about the fixed support posts 52 to adjust the parallelism between the holding surface 20a and the processing surfaces 340a.

For grinding the workpiece W on the grinding apparatus 1 described above, a tilt adjusting process is performed in advance to keep the holding surface 20a of the chuck table 2 and the processing surfaces 340a of the grinding stones 340 parallel to each other. Specifically, the DC power supply 6 is energized to supply DC electric power to the voltage controller 60, which controls the DC voltage value of the supplied DC electric power. The voltage controller 60 supplies DC electric power with the controlled DC voltage value to the piezoelectric actuator 510, which is expanded and contracted in the Z-axis directions to adjust the expansible and contractible support post 51 to a predetermined length. The joint member 54 is angularly moved about the fixed support posts 52 to adjust the parallelism between the holding surface 20a and the processing surfaces 340a.

After the parallelism between the holding surface 20a and the processing surfaces 340a has been adjusted, the workpiece W with the upper surface Wa facing upwardly is placed on the holding surface 20a of the chuck table 2 illustrated in FIGS. 1 and 2. With the workpiece W placed on the holding surface 20a, the suction means 27 is actuated to produce suction force, which is transmitted through the suction channel 28 to the holding surface 20a where the suction force acts therethrough on the workpiece W, holding the workpiece W under suction on the holding surface 20a of the chuck table 20.

With the workpiece W thus held under suction on the holding surface 20a, the horizontal moving means, not shown, is operated to move the chuck table 2 in the Y-axis directions to a position where the chuck table 2 is positioned below the grinding unit 3 as illustrated in FIG. 1. Then, the electric motor 220 of the table rotating means 22 is energized to produce rotational power that is transmitted by the transmission belt 221 to the support 24, which is rotated about the rotational axis 25. The chuck table 2 and the workpiece W held under suction on the holding surface 20a of the chuck table 2 are thus rotated also about the rotational axis 25.

Furthermore, the electric motor 32 of the grinding unit 3 is energized to rotate the spindle 30 about the rotational axis 35, rotating the grinding stones 340 of the grinding wheel 34 that is coupled to the spindle 30 through the mount 33, also about the rotational axis 35.

While the workpiece W is rotating about the rotational axis 25 and the grinding stones 340 are rotating about the rotational axis 35, the grinding unit 3 is lowered by the grinding feed mechanism 4 illustrated in FIGS. 1 and 2 to grind the workpiece W. Specifically, the electric motor 42 is energized to rotate the ball screw 40 about its rotational axis 45. As the ball screw 40 is rotated about the rotational axis 45, the vertically movable plate 43 is lowered in a −Z direction that is one of the Z-axis directions while being guided by the guide rails 41. When the vertically movable plate 43 is lowered in the −Z direction, the holder 44 supported on the vertically movable plate 43 and the grinding unit 3 supported by the holder 44 are also moved in the −Z direction until the processing surfaces 340a of the grinding stones 340 abut against the upper surface Wa of the workpiece W held on the holding surface 20a of the chuck table 2, starting to grind the workpiece W.

While the workpiece W is being ground, before the workpiece W is thinned to a finished thickness, for example, the non-contact thickness measuring means 7 measures the thicknesses of the workpiece W at respective three locations, i.e., an outer circumferential edge We of the workpiece W, the center Wo of the workpiece W, and an intermediate position Wh between the outer circumferential edge We and the center Wo of the workpiece W, i.e., a position on the circumference of a circle whose radius is one-half of the radius of the circle representing the workpiece W, as illustrated in FIG. 2. If the measured thicknesses at the three locations are not equal to each other, the tilt of the chuck table 2 is adjusted by the tilt adjusting mechanism 5 to make the measured thicknesses at the three locations equal to each other. Specifically, in a manner similar to the tilt adjusting process described above, the DC power supply 6 is energized to supply DC electric power to the voltage controller 60, which controls the DC voltage value of the supplied DC electric power on the basis of the measured thicknesses at the three locations. The voltage controller 60 supplies DC electric power with the controlled DC voltage value to the piezoelectric actuator 510, which is appropriately expanded and contracted in the Z-axis directions to adjust the expansible and contractible support post 51 to a predetermined length. The joint member 54 is angularly moved about the fixed support posts 52 to adjust the parallelism between the holding surface 20a and the processing surfaces 340a.

By changing the voltage supplied to the piezoelectric actuator 510 using the voltage controller 60, as described above, the length of the expansible and contractible support post 51 is changed to adjust the tilt of the holding surface 20a. The tilt of the holding surface 20a is thus reliably changed by a desired degree. With the processing surfaces 340a and the holding surface 20a being kept parallel to each other, the workpiece W is ground to a finished thickness by the grinding unit 3. The workpiece W can thus be finished to a uniform thickness in its entirety.

Inasmuch as the tilt of the holding surface 20a of the chuck table 2 can be changed by expanding and contracting the piezoelectric actuator 510, rather than a conventional externally threaded shaft, using the tilt adjusting mechanism 5, it is not necessary to eliminate backlash for changing the tilt of the chuck table 2, and hence, the amount of work required for tilt adjustment is reduced. Furthermore, the tilt of the chuck table 2 can be adjusted by a slight degree by slightly changing the DC voltage value of the DC electric power supplied to the piezoelectric actuator 510 with the voltage controller 60. Therefore, it is possible for the tilt adjusting mechanism 5 to perform finer tilt adjustment.

Moreover, if a grinding apparatus has a turntable as a table base, then, at least two chuck tables are disposed on the turntable. Providing each of the chuck tables is supported by at least three support posts including respective piezoelectric actuators, the heights of the upper surfaces of the two chuck tables can be equalized by controlling DC voltages applied to the respective piezoelectric actuators. Since workpieces on the chuck tables can then be processed in such a manner that processing surfaces are kept at the same height, a processing fluid is uniformly supplied to the workpieces on the chuck tables, developing no difference between processed results on the two chuck tables.

The embodiment described above illustrates the tilt adjusting mechanism for the chuck table according to the present invention as applied to the grinding apparatus. However, the present invention is not limited to the illustrated embodiment, but is also applicable to tilt adjusting mechanisms for chuck tables of other processing apparatus such as a cutting apparatus, a polishing apparatus, or the like.

The present invention is not limited to the details of the above described preferred embodiment. The scope of the invention is defined by the appended claims and all changes and modifications as fall within the equivalence of the scope of the claim are therefore to be embraced by the invention.

What is claimed is:

1. A tilt adjusting mechanism provided in a processing apparatus including a chuck table having a holding surface for holding a workpiece thereon and a processing unit having a processing surface for processing the workpiece held on the chuck table, for adjusting parallelism between the holding surface and the processing surface, wherein the chuck table is supported by a base, and further wherein an annular joint member surrounds the base, the tilt adjusting mechanism comprising:

at least three support posts supporting the chuck table, the support posts including at least one expansible and contractible support post that is provided with a piezoelectric actuator comprising layered piezoelectric elements, wherein the at least three support posts support the annular joint member;

a direct current power supply electrically connected to the piezoelectric actuator; and a voltage controller for controlling a direct current voltage value of direct current electric power supplied to the piezoelectric actuator, wherein the DC electric power whose direct current voltage value has been controlled by the voltage controller is supplied to the piezoelectric actuator to control the length of the expansible and contractible support post for thereby adjusting the parallelism between the holding surface and the processing surface, and wherein the base and chuck table are configured and arranged to rotate with respect to the annular joint member.

* * * * *